(12) United States Patent
Vuorela (10) Patent No.: US 6,933,505 B2
(45) Date of Patent: Aug. 23, 2005

(54) LOW TEMPERATURE, BUMP-BONDED RADIATION IMAGING DEVICE

(75) Inventor: Mikko Ilmari Vuorela, Helsinki (FI)

(73) Assignee: Oy Ajat LTD, Espoo (FI)

(*) Notice: Subject to any disclaimer, the term of this patent is extended or adjusted under 35 U.S.C. 154(b) by 0 days.

(21) Appl. No.: 10/126,254

(22) Filed: Apr. 19, 2002

(65) Prior Publication Data

US 2003/0173523 A1 Sep. 18, 2003

Related U.S. Application Data

(60) Provisional application No. 60/364,249, filed on Mar. 13, 2002.

(51) Int. Cl.[7] ............................................. H01J 40/14
(52) U.S. Cl. .......................... 250/370.13; 250/370.11
(58) Field of Search ................... 250/370.13, 370.11, 250/370.08, 370.09, 370.14, 370.01, 339.02, 208.1, 214.1, 214 R, 208.2; 257/432, 446, 225; 420/562; 228/180.1, 180.21, 180.22; 174/256

(56) References Cited

U.S. PATENT DOCUMENTS

| | | | | |
|---|---|---|---|---|
| 5,269,453 A | * | 12/1993 | Melton et al. ......... | 228/180.22 |
| 5,316,205 A | * | 5/1994 | Melton .................. | 228/180.21 |
| 5,619,040 A | * | 4/1997 | Shapiro et al. ........ | 250/370.09 |
| 5,730,932 A | * | 3/1998 | Sarkhel et al. ........ | 420/562 |
| 5,952,646 A | | 9/1999 | Spartiotis et al. | |
| 6,207,944 B1 | * | 3/2001 | Spartiotis et al. ........ | 250/208.1 |
| 6,238,599 B1 | * | 5/2001 | Gelorme et al. ........ | 252/514 |
| 6,296,722 B1 | | 10/2001 | Nishimura | |
| 6,319,461 B1 | | 11/2001 | Domi et al. | |
| 6,325,279 B1 | | 12/2001 | Sakai et al. | |
| 6,334,570 B1 | | 1/2002 | Koshi et al. | |
| 6,359,283 B1 | * | 3/2002 | Gordon et al. ......... | 250/370.13 |
| 6,365,097 B1 | | 4/2002 | Yamashita et al. | |
| 6,486,411 B2 | * | 11/2002 | Miura et al. ........ | 174/256 |
| 2003/0019917 A1 | * | 1/2003 | Furuno et al. ........ | 228/246 |

\* cited by examiner

Primary Examiner—David Porta
Assistant Examiner—Otilia Gabor
(74) Attorney, Agent, or Firm—Moetteli & Associate; John Moetteli (57) ABSTRACT

An x-ray and gamma-ray radiant energy imaging device is disclosed having a temperature sensitive semiconductor detector substrate bump-bonded to a semiconductor CMOS readout substrate. The temperature sensitive, semiconductor detector substrate utilizes Tellurium compound materials, such as CdTe and CdZnTe. The bump bonds are formed of a low-temperature, lead-free binary solder alloy having a melting point between about 100° C. and about 180° C. Also described is a process for forming solder bumps utilizing the low-temperature, lead-free binary solder alloy, to prevent damage to temperature sensitive and potentially brittle detector substrate when assembling the imaging device.

16 Claims, 5 Drawing Sheets

Legend:
- Si
- Photoresist Mask
- Conductor
- UBM 3
- Passivation
- Bump Metal 1
- UBM 1
- Bump Metal 2
- UBM 2
- Metal 1 - Metal 2 Alloy Silicon 6" Wafer

(Wafer is cleaned before each individual process step)

Field Metallization:
- UMB 1 (Under Bump Metallization) *(TiW)*
- UMB 2 *(Cu)*

Photoresist Mask:
- Mask Alignment and Exposure
- Mask Development

Electrochemical Plating:
- UMB 3 *(Ni)*
- Bump Metal 1 *(Bi)*
- Bump Metal 2 *(Sn)*

Figure 4B
Process Flow Chart – Bumping (continued)
(Drawings not in scale!)

⇩

Photoresist Removal

⇩

Etching:
- UMB 1
- UMB 2

⇩

Reflow / Balling
- Metal 1 – Metal 2 Alloy *(SnBi alloy, bump height 10μm or larger)*

⇩

Dicing

⇩

Testing
- Probe Station

LOW TEMPERATURE, BUMP-BONDED RADIATION IMAGING DEVICE

The present application claims the benefit of prior filed U.S. Provisional Application, Ser. No. 60/364,249 filed Mar. 13, 2002, to which the present application is a regular U.S. national application.

FIELD OF THE INVENTION

The present invention is in the field of semiconductor imaging systems for imaging x-ray and gamma ray radiant energy above 1 keV. More specifically, the invention relates to such radiant energy imaging systems utilizing semiconductor devices containing Cadmium and/or Tellurium detector substrates bonded with Bismuth/Tin based, low temperature binary solder alloys.

BACKGROUND OF THE INVENTION

Over the past ten years digital radiation imaging has gradually been replacing conventional radiation imaging for certain applications. In conventional radiation imaging applications, the detecting or recording means is a photosensitive film or an analog device such as an Image Intensifier. Digital radiation imaging is performed by converting radiation impinging on the imaging device to an electronic signal inside a converting material and consequently digitizing such electronic signal.

Devices for performing digital radiation imaging currently exist. In some such devices, the impinging or incident radiation is converted locally into electrical charge which is then collected at collection contacts/pixels, and then communicated as electronic signals to readout circuits. The readout circuits perform various functions including digitization. In other devices, the impinging radiation is converted into light which is then subsequently converted to an electronic signal which is read out and digitized. The first instance is referred to as direct radiation detection and the second as indirect radiation detection.

Direct radiation detection devices typically comprise a photo-conductor substrate or detector which converts the impinging radiation into electronic signals. The detector substrate is conductively bonded to a readout substrate which receives the electronic signals, processes and reads them out, i.e., conditions the signals for imaging. There are different kind of photo-conductor/detector substrate technologies and different readout substrate technologies used in direct radiation detection devices. These include: SBBASIC (Semiconductor Bump-Bonded on ASIC), a-SGTFT (amorphous Semiconductor Grown on TFT), and a-SGASIC (amorphous Semiconductor Grown on ASIC). ASIC stands for Application Specific Integrated Circuit and TFT stands for Thin Film Transistor array.

SBBASIC type imaging devices typically comprise at least two substantially coplanar semiconductor substrates: a crystalline semiconductor detector substrate (photoconductor) discretely bonded to a semiconductor readout substrate. The detector substrate has a continuous bias electrode on its first major surface and a two dimensional array of charge collecting contacts on its second opposite major surface. Incoming radiation impinges on the first surface of the detector substrate and is absorbed by the photo-conductor material. Electrical charges are generated in the photo-conductor material in response to the absorption of the radiation. Under the influence of an electrical field bias created by the electrode, the generated charges drift toward and are collected at the charge collector contacts (or charge collection electrodes) at the second surface of the detector. Each charge collector contact defines a "pixel" on the detector substrate second surface. Each pixel is individually and conductively connected to a corresponding "pixel circuit input" on the adjacent surface of the readout substrate by an individual bump-bond. Each pixel circuit input is an input to an ASIC processed on the readout substrate. The ASIC includes a plurality of various circuit features for amplifying, storing, digitizing, etc. the electrical charge signals.

Various types of bump-bond solders are known in the art for conductively bonding corresponding pixels and pixel circuit inputs on the semiconductor substrates of SBBASIC devices. Most of these solder alloys include elemental Lead as a component, which is an environmental pollutant and processes which utilize this substance can create a toxic waste stream. It would be beneficial in the field to have a lead-free solder alloy for accomplishing bump bonds, to avoid or reduce production of this toxic waste stream.

Lead free solders for various high tech electronic applications are known in the art. For example, Nishimura, U.S. Pat. No. 6,296,722, discloses a lead-free solder alloy characterized by and comprising Tin, Copper and Nickel having a melting point of approximately 227° C. Domi et al., U.S. Pat. No. 6,319,461, disclose a lead-free solder alloy consisting of Tin and Titanium. However, this alloy has a melting point of 250° C., and must be further alloyed with other metals in order to lower its melting point. Even when so alloyed, Domi et al. do not disclose a lead-free solder alloy having a melting point below about 203° C. Sakai et al. disclose a ternary lead-free solder for joining electronic parts having Tin, Silver and Copper as its principle components. The Sakai solder may be further alloyed with additional metals, however, the melting point disclosed for the various Sakai alloys is still above the melting point of a eutectic PbSn solder. Koshi et al., U.S. Pat. No. 6,334,570, disclose a soldering method using a preliminary "tinning" or coating alloy of Tin and Copper and a soldering alloy of Tin, Silver, Copper and Bismuth or variation thereof. The melting point of the Koshi "tinning" alloy is 227° C., and the melting point of the soldering alloy is 217° C. Most recently, Yamashita et al., U.S. Pat. No. 6,365,097, disclose a lead-free, quaternary based solder alloy comprising Bismuth, Tin and Silver with Nickel and/or Germanium and with or without Copper. Although the melting points of the various Yamashita solder alloys are not clearly set forth, the lowest reported melting point is 185° C.

The melting point of a solder alloy for use in forming bump-bonds is important because the new high resolution semiconductor imaging devices often comprise temperature sensitive detector substrates. Temperature sensitive substrates are those which potentially can suffer deleterious affects upon exposure temperatures above about 180° C. in the process of producing the imaging device of which they are a component. Although the above noted lead-free solders may be useful for their intended purposes, their relatively high melting point temperatures may make them unsuitable for certain bump-bonding applications involving such temperature sensitive semiconductor substrates. For example, temperature sensitive semiconductor detector substrates include some of the currently most promising intermetallic or compound semiconductor materials, such as Cadmium-Telluride (CdTe) and Cadmium-Zinc-Telluride (CdZnTe). However, current bump-bonding techniques using eutectic PbSn solders (melting point ~183° C.), or the above mentioned lead-free solders, cannot fulfill all the requirements for assembling the semiconductor substrates of these new high-density, temperature sensitive imaging devices. Therefore, it would be further beneficial in the art to have an alternative solder alloy for forming bump-bonds that has a relatively low melting point (below eutectic PbSn alloys) and also is lead-free.

Additionally, while each of the above noted solder alloys may have its utility in certain situations, as the complexity of an alloy increases, the accumulative effect of the limitations of the alloy's individual components can render it unsuitable or unpredictable for other applications in respect of the performance, manufacturability, reliability and cost. Some of these limitations are listed below.

Indium (In). In is used in infrared focal arrays. Disadvantages relating to

In as an electronic radiation imaging device interconnect include:

a. Bonding is done with a thermal compression cycle. Bonding pressure can be very high depending on the number of interconnects. This puts severe requirements to the flatness and parallelism of the detectors and readout substrate b. The process is double sided, i.e., both ASIC and detector substrates need to be processed with In bumps. This makes the process expensive.

Lead-Tin (PbSn). PbSn is the oldest solder alloy. Limitations to its use in temperature sensitive electronic imaging devices include:

a. It is a high temperature process. The reflow point of eutectic lead tin is 183° C. which is too high for the most x-ray sensitive and novel detector materials such as CdTe (Cadmium Telluride) and CdZnTe (Cadmium Zinc Telluride).

b. It contains lead (Pb) which is progressively banned from manufacturing processes.

Bismuth-Lead-Tin (BiPbSn). BiPbSn is a low temperature solder alloy useful with reflow processes, but has the following limitations:

a. It is a three metal alloy making it harder to control. Strict and continuous process control is needed to ensure good manufacturing yield and reliability. Three metals alloying together makes this process more complicated than the rest.

b. It has a eutectic reflow temperature of about 94° C. At this low temperature a lot of commercial under-filling materials cannot polymerize properly. Under-filling is used during or after bump-bonding to provide reliability and long term endurance to the bonds. But such under-fills are cured typically between 95° C. and 120° C. which would make the BiPbSn solder reflow again. In relation to CdTe and CdZnTe electronic radiation imaging devices this is a severe limitation because it removes the option of an under-fill which is needed in many cases.

c. It contains Pb which is progressively banned from the manufacturing processes. Such electronic radiation imaging devices are described for example in U.S. Pat. No. 5,952,646 disclosed herewith.

Gold (Au. Gold stud bumps have been used for some time in prototype electronic imaging devices, but Au has the following limitations:

a. The temperature is too high for use with temperature sensitive materials such as CdTe and CdZnTe.

b. There is a limitation on the minimum pitch that can reliably be achieved in pixel arrays.

c. Manufacturing throughput is lower than that of wafer scale processes.

Indium-Tin (InSn). InSn solder alloy is a relatively low temperature process, but has the limitation that Indium oxidizes naturally within seconds from deposition and it makes the reflow bonding process unreliable.

In view of the above, it would be beneficial in the field to have a less complicated low temperature, lead free solder that did not require the alloying of several different metals to accomplish its utility. Some of the advantages of a lead-free, low temperature, binary solder alloy should embody include:

a reflow (melting point) temperature that is lower than that of eutectic PbSn (183° C.), but higher than the reflow temperature of BiPbSn (under 100° C.). This would allow bump-bonding of temperature sensitive photo-conductors such as CdTe and CdZnTe, and at the same time not limit the use of under-fills.

only two component metals.

it should be lead-free.

it should not oxidize or at least not oxidize as fast as InSn it can be initially applied only to the readout substrates (ASIC) while still incorporated on the ASIC wafer, thus making manufacturing throughput higher (unlike In bumping).

bump-bonding is accomplished via a reflow state, thus the process is much more forgiving to substrate anomalies and lack of flatness (unlike In bonding).

SUMMARY OF THE INVENTION

The current invention discloses an electronic radiation imaging device comprising a detector semiconductor substrate for converting incoming radiation to electrical charge, a plurality of charge collection contacts on one major face of the detector substrate, a semiconductor readout/processing substrate for receiving the charge, via the charge collection contacts on the detector substrate being electrically connected to input circuit contacts on the readout/processing substrate by means of lead-free, Bismuth-Tin (BiSn) solder alloy bump-bonds. The BiSn solder comprises a low temperature bump-bonding process that allows reliable, high yield manufacturing of CdTe and CdZnTe electronic radiation imaging devices. A device in accordance with the present invention has the following important features or advances: the solder bump reflow temperature is lower than that of eutectic PbSn (183° C.), but higher than the reflow temperature of eutectic BiPbSn (about 94° C.), thus allowing bump-bonding of temperature sensitive photo-conductors and the use of under-fills; the solder alloy involves only two metals, the solder is lead-free; the solder does not oxidize like InSn; the solder can be initially applied to the readout substrates (ASIC) as solder bumps while the ASIC is still incorporated on the ASIC wafer, thus making manufacturing throughput higher; and bump-bonds can then be accomplished using reflow bonding techniques, making the bonding process relatively forgiving to substrate anomalies and lack of flatness.

The x-ray and gamma-ray radiant energy imaging device of the present invention comprises a semiconductor detector substrate, a semiconductor readout/processing substrate and a low-temperature, lead-free solder electrically interconnecting the two semiconductor substrates.

The semiconductor substrates of the present invention have a generally planar configurations and are disposed adjacent each other in as coplanar relationship. Typical, one or both of the semiconductor substrates practiced in the present invention are comprised of a temperature sensitive material. Specifically, it is anticipated that it is the detector (photo-conductor) substrate that is comprised of a temperature sensitive material. More specifically, the temperature sensitive detector substrates of the present invention comprise the element Cadmium (Cd) and/or the element Tellurium (Te). Examples of such temperature sensitive detector/photo-conductor materials include CdTe and CdZnTe, which materials are better process using bonding techniques involving temperatures under 180° C.

The present detector or photo-conductor substrate has a front irradiation surface and a back pixel surface. The material of the detector substrate is disposed to absorb radiant energy impinging on the front irradiation surface and to convert it to electrical charge. The detector substrate has an electric field bias acting to cause an electric charge generated within the thickness of the detector substrate in response to absorbed radiation to drift directly toward the pixel surface of the detector substrate. An electric field bias can be accomplished by having a charge biasing electrode disposed continuously across the front surface of the detector substrate. On the back pixel surface of the detector/photo-conductor substrate is a plurality of pixels and associated charge collector contacts disposed in a collector contact pattern. The pixel collector contacts collect drifting electrical charges generated within the detector substrate.

The readout/processor substrate has a readout surface adjacent the back pixel surface of the detector substrate. A plurality of readout contacts are mounted on the readout surface of the readout/processor substrate. The readout contacts are disposed in a readout contact pattern, with the readout contact pattern corresponding to the collector contact pattern of the detector substrate. Each readout contacts receive the electrical charge from its corresponding collector contact on the detector substrate.

Communication of electrical charge between the collector contacts of the detector substrate and the readout contacts of the readout substrate is accomplished in the present invention via a low-temperature, lead-free solder, which electrically interconnects corresponding collector and readout contacts. A low-temperature, lead-free solder for practice in the present invention has a melting point between about 100° C. and about 180° C. Also, the electrical interconnects between corresponding collector and readout contacts preferably is accomplished using bump-bonds. An example of a preferred low-temperature, lead-free solder for practice in the present invention is a metal alloy of Bismuth and Tin (BiSn). The alloy may have other non-metallic components. Additionally, the alloy may have other trace metal impurities which do not substantially affect the physical characteristics of the primary binary metal alloy of Bismuth and Tin.

A BiSn low-temperature, lead-free solder of the present invention consisting essentially of an alloy of either Tin or Bismuth ranging between about 1% to 85% by weight. Preferably, the present low-temperature, lead-free solder consisting essentially of an alloy of either Tin or Bismuth ranging between about 38% to 58% by weight. Most preferably, the present low-temperature, lead-free solder consisting essentially of an alloy approximating an eutectic alloy of Bismuth and Tin, and has a melting point of about 138° C. (48% wt Sn, 52% wt Bi). Generally, the present low-temperature, lead-free solders consist essentially of an alloy of Bismuth and Tin having a melting point temperature below the melting temperature of an eutectic alloy of Lead and Tin.

DETAILED DESCRIPTION OF THE INVENTION

Referring now to the drawings, the details of preferred embodiments of the present invention are graphically and schematically illustrated. Like elements in the drawings are represented by like numbers, and any similar elements are represented by like numbers with a different lower case letter suffix.

Figure 1:
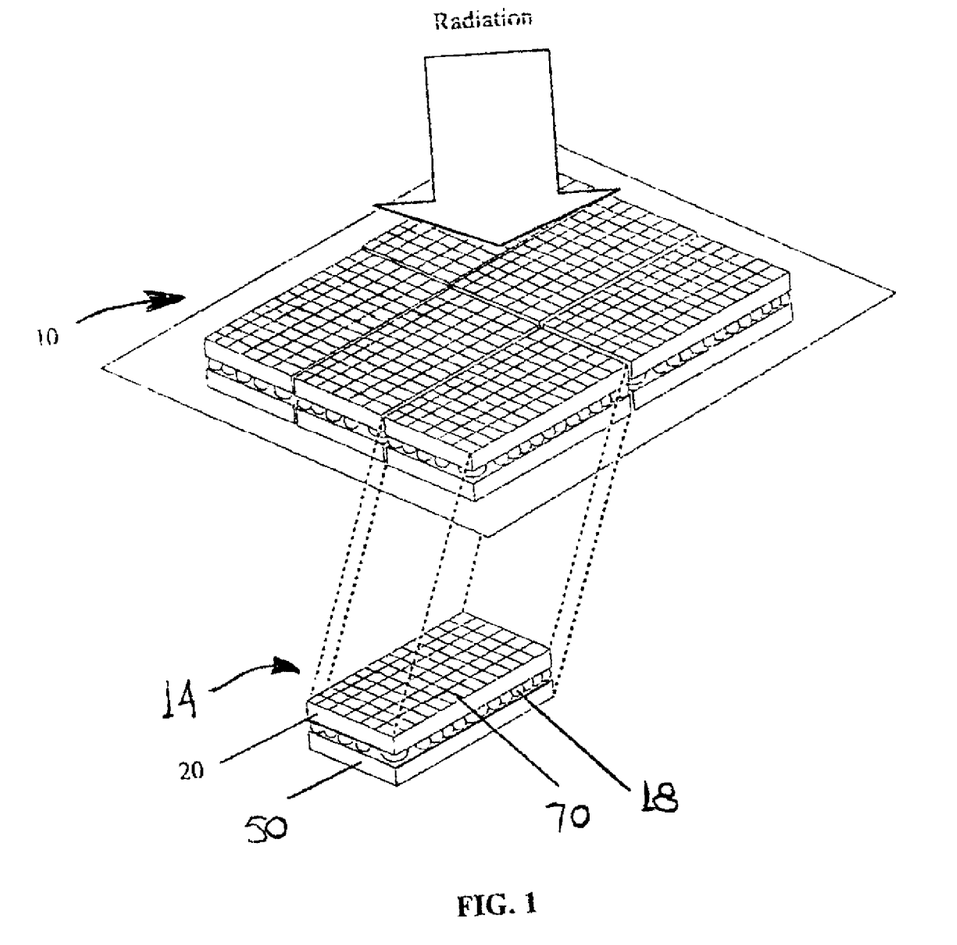
FIG. 1 is an exemplary illustration of an imaging system showing the generally two dimensional, planar configuration of a matrix of individual imaging devices forming the imaging system.

As shown in FIG. 1, the present invention is an x-ray and gamma-ray radiant energy imaging device 14 for use in an imaging system 10, which consists of one or more imaging devices 14 arranged in a one or two dimensional matrix. The imaging device 14 comprises a semiconductor image detector (photo-conductor) substrate 20 and a semiconductor readout/processor substrate 50. The two semiconductor substrates 20 & 50 are bump-bonded together by a plurality of bump-bonds 100. The image detector substrate 20 of the imaging device 14 is composed of individual pixel cells 70. These pixel cells 70 detect high energy radiation (indicated by the larger arrows in the figures) impinging on the detector substrate 20 and pass a signal through the bump-bonds 100 to the readout/processing substrate 50 for further processing and analysis.

The semiconductor substrates 20 & 50 of the present invention have a generally planar configurations and are disposed adjacent each other in as coplanar relationship (see FIG. 1). Typical, at least one of the semiconductor substrates 20 & 50 practiced in the present invention are comprised of a temperature sensitive material. Specifically, it is intended that the detector (photo-conductor) substrate 20 is comprised of a temperature sensitive material. More specifically, the temperature sensitive detector substrates 20 of the present invention comprise the element Cadmium (Cd) and/or the element Tellurium (Te). Examples of such temperature sensitive detector/photo-conductor materials include CdTe and CdZnTe, which materials are better processed using bonding techniques involving temperatures under 180° C. The current invention is intended for use with CdTe and CdZnTe detector substrates which are very sensitive to incoming radiation for energies from 10 keV to over 200 keV. Such detector substrates can be produced at thicknesses varying from 0.5 mm to over 5 mm and with x-y size up to 10 cm² with today's crystal growing technology, and potentially larger than this in the future. The total number of pixels in a single substrate can be as large as 1,000,000. The potential for extremely high densities of bonding point explains the motivation to provide solder bumps that will bond at a reflow (or liquid) state, so that if the opposing substrate surfaces are not exactly co-planar, the pressure exerted on the first few bumps that make contact will not be significantly different from the pressure necessary to assure contact of the remaining solder bumps.

Figure 2A:
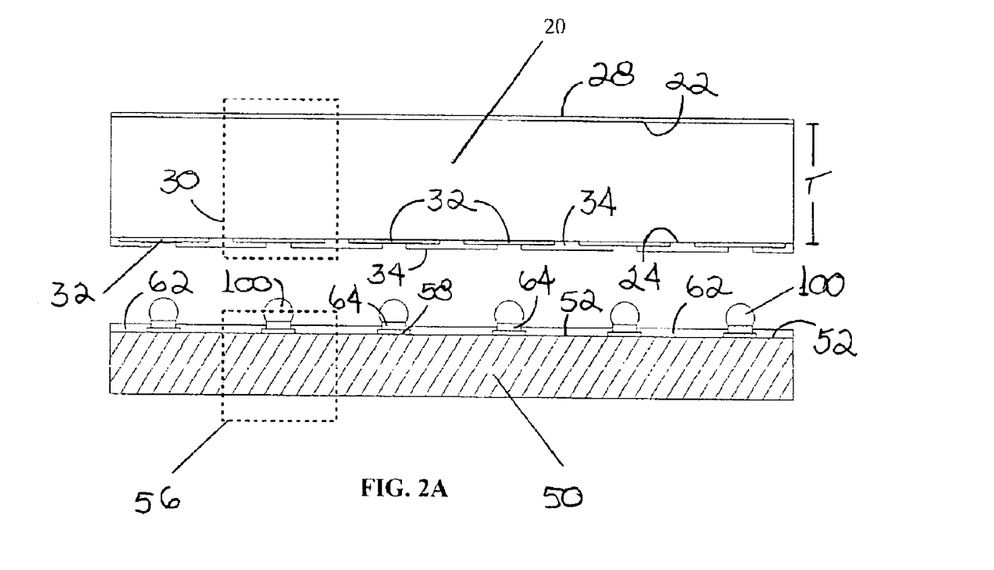
FIG. 2A is a partial cross-section diagram of a device of the present invention illustrating a semiconductor detector substrate in position to be bump-bonded to a semiconductor readout/processor substrate, showing solder bumps initially formed at the input contacts of the pixel circuits, and further illustrating a "detector pixel-to-pixel circuit" unit of the device.
Figure 2B:
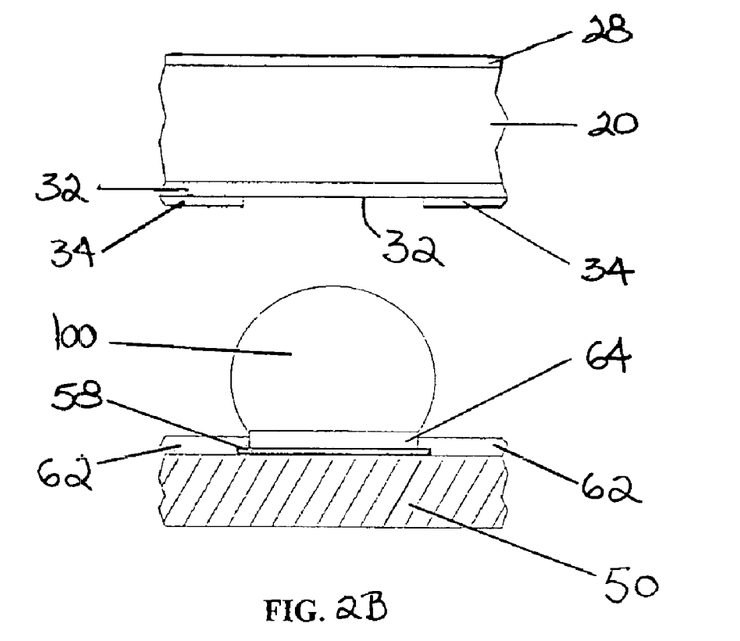
FIG. 2B is a detailed partial cross-sectional diagram of a "detector pixel-to-pixel circuit" unit of the present device from FIG. 2A showing a solder bump initially formed at the input contact of the pixel circuit with the corresponding charge collector contact of the detector pixel disposed in a pre-bonding relationship to the solder bump.

As illustrated in FIGS. 2A and 2B, the present detector/photo-conductor substrate 20 has a front irradiation surface 22 and a back pixel surface 24. The material of the detector substrate 20 is disposed to absorb radiant energy impinging on the front irradiation surface 22 and to convert the absorbed energy to electrical charges. The detector substrate 20 has an electric biasing field acting to cause an electric charge, generated within the thickness T of the detector substrate 20 in response to absorbed radiation, to drift directly toward the pixel surface 24 of the detector substrate 20. As exemplified in the figures, an electric field bias can be accomplished by having a charge biasing electrode 28 disposed continuously across the front surface 22 of the detector substrate 20. Other means for applying an electric bias field are known to the ordinary skilled artisan.

On the back or pixel surface 24 of the detector/photo-conductor substrate 20 is a plurality of pixels 30 and associated charge collector contacts (pixel electrodes) 32 disposed in a collector contact pattern (not shown). The pixel collector contacts 32 collect drifting electrical charges generated within the detector substrate 20. Radiation entering the front surface 22 of the detector substrate 20 generates charges which under the influence of the electric field drift to the most proximate charge pixel collection electrode 32. In the preferred embodiment shown, the pixel electrodes 32 are masked or protected with an insulator or pixel masking material 34 leaving only small openings for bump-bonding.

As also illustrated in FIGS. 2A and 2B, the readout/processor substrate 50 has a readout surface adjacent the back pixel surface 24 of the detector substrate 20. A plurality of readout contacts 56 are mounted on the readout surface 52 of the readout/processor substrate 50. The readout contacts 56 are disposed in a readout contact pattern (not shown) corresponding to the collector contact pattern of the detector substrate 20. Each readout contacts 56 receives the electrical charge from its corresponding collector contact 32 on the detector substrate 20.

In a preferred embodiment, the semiconductor readout/processor substrate 50 is an ASIC (Application Specific Integrated Circuit). In a more specific preferred embodiment, the semiconductor readout/processor substrate 50 is a CMOS type ASIC. On the readout side 52 of the CMOS 50 a plurality of CMOS pixel circuits 56, each pixel circuit 56 corresponding to a detector pixel 30 on the detector substrate 20. The CMOS pixel circuit 56 has a conductive input pad (readout contact) 58 which in the assembled device 14 is in electrical communication with the charge collector electrode 32 of the semiconductor detector substrate 20. The readout contacts 58 receive electrical charge from their corresponding collector electrode (pixel contact). The area of the readout surface 52 of the readout substrate 50 surrounding the readout contacts 58 of the pixel circuits 56 is protected by the readout protection layer or readout insulator 62. In order to improve the compatibility of the materials (both conductive and nonconductive) to physically and electrically connect with each other, e.g., to improve adhesion of the materials, mechanical properties of the interface (joint) between materials and electrical conductivity, one or more layers of under bump metals (UBM) 64 can be applied over the pixel circuit contact (conductive input pad) 58 as an interface between the pixel circuit contact 58 and a solder bump 100.

Figure 3A:
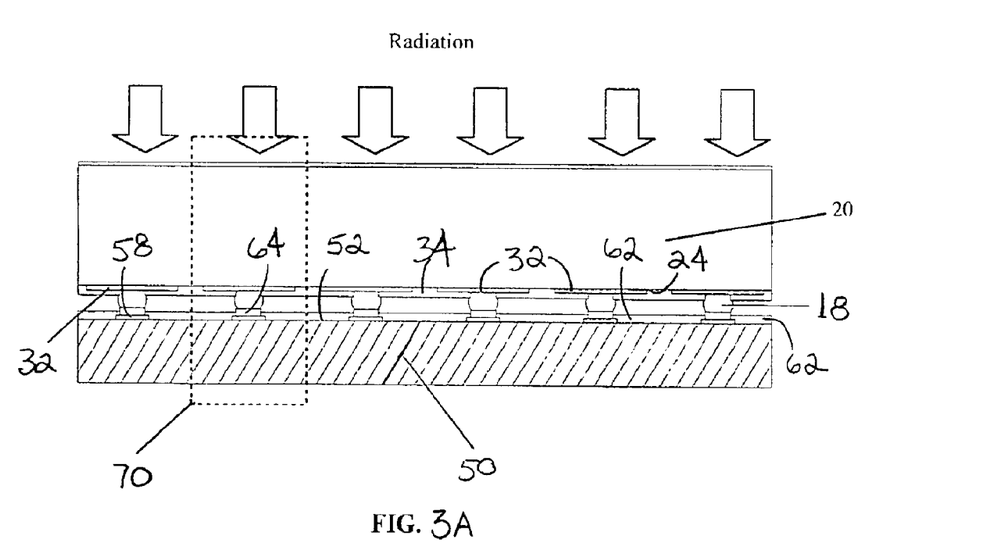
FIG. 3A is a partial cross-sectional diagram of a device of the present invention illustrating a semiconductor detector substrate bump-bonded to a semiconductor readout/processor substrate via a reflow bonding technique.
Figure 3B:
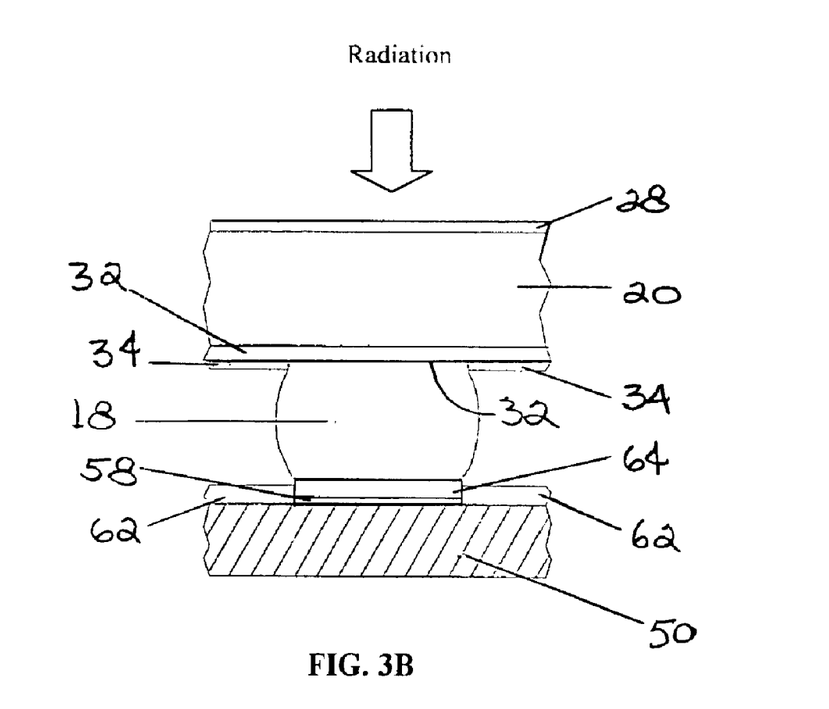
FIG. 3B is a detailed partial cross-sectional diagram of a "detector pixel-to-pixel circuit" unit of the present device from FIG. 3A showing the input contact of the pixel circuit conductively bump-bonded with the corresponding charge collector contact of the detector pixel as would be accomplished using a solder reflow bonding technique.

As shown in FIGS. 3A and 3B, the present imaging device 14 also comprises electrically conductive connections 18 between corresponding pixel electrodes 32 and pixel circuit contacts 58 (also see FIG. 1). The electrically conductive connections 18 are bump-bonds formed from solder bumps 100 (see FIGS. 2A and 2B). In accordance with the present invention, the solder forming the bumps 100, and hence the bump-bonds 18, is a lead-free, low temperature solder alloy comprising Tin (Sn) and Bismuth (Bi). The composition by weight of the lead-free, low temperature solder alloy can be modified in order to suit a specific application as intended in the present invention. In a preferred embodiment, eutectic (48 wt-% Sn; 52 wt-% Bi) or near eutectic composition is used to form the solder bumps 100. The melting point (reflow point) of eutectic Sn—Bi alloy is about 138° C.

However, the amount of both Sn and Bi can vary considerably to any suitable by weight ratio without diverting from the scope of the invention for a binary BiSn, lead-free solder with a melting point suitable for flip-chip bonding of Cd based compound semiconductors. Such limiting temperature varies depending in the exact composition of the compound semiconductor 20 and also depends at least in part on the electrode metals used for forming the bias electrode 28 and the charge collection contacts 32 and the nature of their attachment to the material of the compound semiconductor 20. This limiting temperature is also a function of time in the bump-bonding cycle and according to the findings of this disclosure such temperature should in most circumstances be under 210° C. and preferably under 183° C.

The solder bumps 100 can be initially formed on either the detector substrate 20 or the readout substrate 50. Any of a number of means known to the ordinary skilled artisan can be used to form the solder bumps 100 on either of the semiconductor substrates 20 & 50, including for example, by electrolysis or by an electrochemical plating process. Additionally, the solder bumps 100 can be grown both on either of the semiconductor substrates 20 & 50. However, in the preferred embodiment, solder bumps 100 are initially formed on the readout substrate CMOS 50, rather than the detector substrate 20. The benefit of initially forming the solder bumps 100 on the readout substrate CMOS 50, minimizing the risk of possible damage to the image detector substrate 20 in the process of assembling the device 14. By only applying the solder bumps 100 to the readout substrate CMOS 50, the temperature sensitive detector substrate (e.g., containing CdTe or CdZnTe detector materials, which can also be brittle) are spared exposure to the heat and manipulations of the bumping process.

Figure 4:
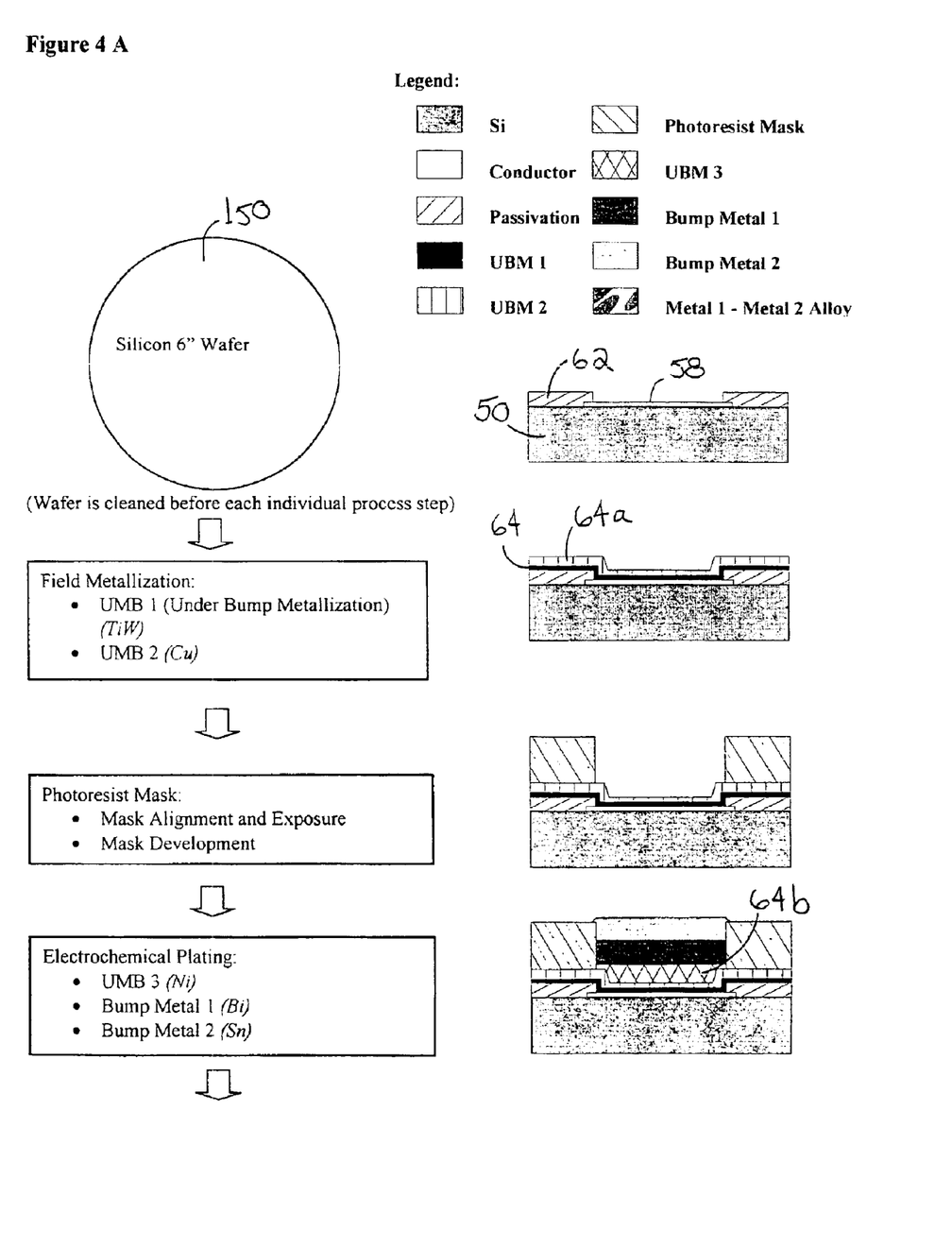
FIGS. 4A and 4B provide a flow chart of one way of accomplishing BiSn bumps on an ASIC wafer for practicing a radiation imaging device in accordance with the current invention.
Figure 4B:
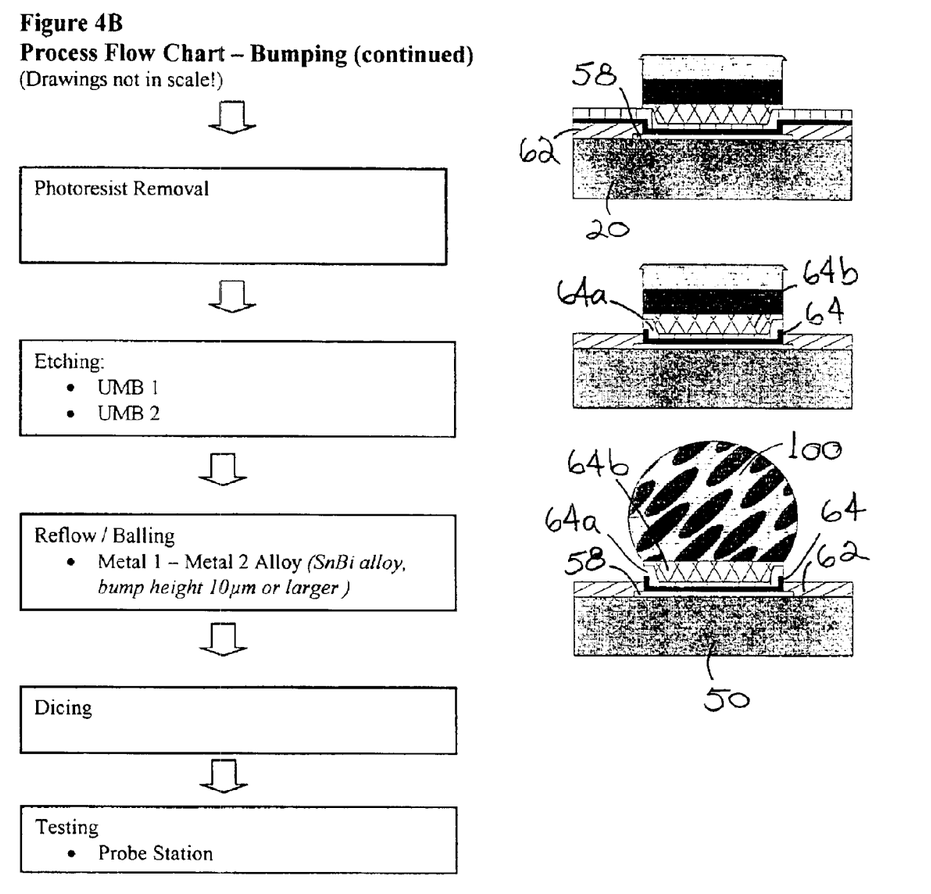

FIGS. 4A and 4B are a flow chart illustrating an example of a bumping process practicable for forming the bumps 100 of the present imaging device 14. Vacuum evaporation can also be used. The alloying metals can be deposited in two or more layers in order to achieve the wanted composition of the alloy with accuracy. This sandwich structure is reflowed prior to bonding, but can also be bonded as such.

After bumping, the readout CMOS substrate 50 is then bump-bonded with the image detector substrate 20 as indicated in FIGS. 3A and 3B. In accomplishing this, after the readout CMOS substrate 50 image detector substrate 20 are aligned to have corresponding pixel circuit contacts 58 and pixel electrodes 32 juxtaposed, the semiconductor substrates 20 & 50 are brought together so that the solder bumps 100 on the pixel circuit contacts mate with their corresponding pixel electrodes 32. Simultaneously, adequate bonding pressure is applied and temperature is raised sufficiently above the melting point of the BiSn lead-free, low temperature (by ~20° C.) to cause the solder bump 100 to reflow (melt) and bond with the juxtaposed pixel electrode 32. This bonding is conducted in a such manner that minimum time is spent above liquidus or reflow (melting) temperature of the BiSn lead-free, low temperature solder, and hence no damage is caused to the temperature sensitive semiconductor detector substrate 20. As a result, a metallurgical bond is formed between the readout CMOS substrate 50 and image detector substrate 20 via bump-bonding of corresponding pixel circuit contacts 58 and pixel electrodes 32.

Furthermore, an under-fill (not shown) can be applied if it is needed to improve the mechanical properties of the imaging device 14. An under-fill can also be applied as a no-flow under-fill before the bonding pressure and heat are applied. Under-fill techniques are known in the art and are readily practicable in the present invention by the ordinary skilled artisan. Many commercially under-fill materials currently available cure at approximately 100° C. The potential temperature susceptibility of under-fills during soldering of an imaging device's detector and readout substrates makes it beneficial that the present BiSn lead-free, low temperature solder has a melting point sufficiently above the temperature at which these commercially available under-fill materials cure.

Besides protecting temperature sensitive semiconductor detector substrates 20 comprising, for example Cd, the low bonding temperature and short liquid time of the present binary solder alloy decreases the amount of possible intermetallic compounds that can form and also minimizes internal stresses which are caused during solidification and cooling by mismatch of the coefficients of thermal expansion (CTE) of the substrate materials.

We have disclosed an electronic radiation imaging device for imaging x-rays and gamma rays above 1 keV comprising a detector semiconductor substrate for converting incoming radiation hits to charge, a plurality of charge collection contacts on one major face of said detector substrate, further comprising a semiconductor readout/processing substrate for receiving said charge, whereas said charge collection contacts on the detector substrate are electrically connected to inputs on the readout/processing substrate by means of lead (Pb) free, Bismuth Tin (BiSn) based bump-bonds. A particularly significant embodiment of the current invention is when the detector substrate is CdTe or CdZnTe. In accordance with a preferred embodiment the BiSn bumps have a reflow (or melting point) between 100° C. and that of eutectic PbSn.

The composition by weight of the BiSn bumps can vary but preferably the composition is that or close to eutectic BiSn with a melting point around 134° C. By way of example, one possible process flow chart is herein disclosed how to implement a BiSn bumping process on a wafer 150 (see FIGS. 1 and 4) carrying the readout/processing CMOS substrates 50. See FIGS. 4A and 4B.

Many variations and changes can be envisioned without departing from the scope of the invention. For example there can be other temperature sensitive radiation detector materials such as PbI, HgI, GaAs, etc.

While the above description contains many specifics, these should not be construed as limitations on the scope of the invention, but rather as exemplifications of one or another preferred embodiment thereof. Many other variations are possible, which would be obvious to one skilled in the art. Accordingly, the scope of the invention should be determined by the scope of the appended claims and their equivalents, and not just by the embodiments.

What is claimed is:

1. An x-ray and gamma-ray radiant energy imaging device comprising:

a detector substrate, the detector substrate having a front surface and a back surface, and disposed to convert said radiant energy impinging on the front surface to electrical charge;

a plurality of charge collector contacts mounted on the back surface of the detector substrate in a collector contact pattern, the collector contacts for collecting the electrical charge;

a readout substrate having a readout surface and a plurality of readout contacts mounted on the readout surface in a readout contact pattern, the readout contact pattern corresponding to the collector contact pattern, and the readout contacts for receiving electrical charge from corresponding collector contacts; and a low-temperature, lead-free solder bump electrically interconnecting a corresponding collector and readout contact, the lead-free solder bump having a melting point between about 95° C. and about 183° C.

2. The radiant energy imaging device of claim 1, wherein the detector substrate is a temperature sensitive, compound semiconductor substrate.

3. The radiant energy imaging device of claim 1, wherein the detector substrate comprises the element Tellurium.

4. The radiant energy imaging device of claim 3, wherein the detector substrate further comprises the element Cadmium.

5. The radiant energy imaging device of claim 1, wherein the low-temperature, lead-free solder bump is disposed as bump-bonds to electrically interconnect the corresponding collector and readout contacts.

6. The radiant energy imaging device of claim 1, wherein the low-temperature, lead-free solder is a metal alloy comprising Tin.

7. The radiant energy imaging device of claim 1, wherein the low-temperature, lead-free solder is a binary metal alloy consisting essentially of Tin and another metal.

8. The radiant energy imaging device of claim 1, wherein the low-temperature, lead-free solder comprises a binary alloy consisting essentially of the metals Bismuth and Tin.

9. The low-temperature, lead-free solder of claim 8 consisting essentially of an alloy of Tin and Bismuth ranging between about 1% to 85% Tin by weight.

10. The low-temperature, lead-free solder of claim 8 consisting essentially of an alloy of Tin and Bismuth ranging between about 38% to 58% Tin by weight.

11. The low-temperature, lead-free solder of claim 8 consisting essentially of an eutectic alloy of Bismuth and Tin.

12. The low-temperature, lead-free solder of claim 8 having a melting point of about 138° C.

13. The low-temperature, lead-free solder of claim 8 consisting essentially of an alloy of Bismuth and Tin having a melting point temperature below the melting temperature of an eutectic alloy of Lead and Tin and higher than the melting temperature of an alloy of Bismuth, Lead and Tin.

14. The low-temperature, lead-free solder of claim 8 comprising an alloy the metals of which consist essentially of Bismuth and Tin, and which solder has a melting point temperature below the melting temperature of an eutectic alloy of the metals Lead and Tin.

15. An x-ray and gamma-ray radiant energy imaging device comprising:
- a temperature sensitive, compound semiconductor detector substrate having a front surface and a back surface, and disposed to convert said radiant energy impinging on the front surface to electrical charge;
- a plurality of charge collector contacts mounted on the back surface of the detector substrate in a collector contact pattern, the collector contacts for collecting the electrical charge;
- a readout substrate having a readout surface and a plurality of readout contacts mounted on the readout surface in a readout contact pattern, the readout contact pattern corresponding to the collector contact pattern, and the readout contacts for receiving electrical charge from corresponding collector contacts; and
- a low-temperature, lead-free solder bump electrically interconnecting a corresponding collector and readout contact, the lead-free solder being a Tin based binary metal alloy and having a melting point between about 95° C. and about 183° C.

16. A method for producing an x-ray and gamma-ray radiant energy imaging device comprising the steps of:
- providing a semiconductor readout substrate having a plurality of readout contacts mounted on a readout surface in a readout contact pattern;
- applying a low-temperature, lead-free solder bump to each of the readout contacts using a lead-free, Tin based binary metal alloy and having a melting point below the eutectic melting point of a Lead and Tin solder alloy;
- disposing a temperature sensitive, compound semiconductor detector or substrate having a pixel surface with a plurality of charge collector contacts mounted on the pixel surface in a collector contact pattern corresponding to the readout contact pattern in a position to bond corresponding readout contacts and charge collector contacts; and bonding the compounding readout contacts and charge collector contacts by a solder reflow technique to form electrically conductive bump-bonds between the corresponding readout contacts and charge collector contacts and provide said radiant energy imaging device.

* * * * *

(12) EX PARTE REEXAMINATION CERTIFICATE (10280th)
United States Patent
Vuorela (10) Number: US 6,933,505 C1
(45) Certificate Issued: Sep. 2, 2014

(54) LOW TEMPERATURE, BUMP-BONDED RADIATION IMAGING DEVICE

(75) Inventor: Mikko Ilmari Vuorela, Helsinki (FI)

(73) Assignee: Oy Ajat Ltd., Espoo (FI)

Reexamination Request:
No. 90/011,681, May 10, 2011

Reexamination Certificate for:
Patent No.: 6,933,505
Issued: Aug. 23, 2005
Appl. No.: 10/126,254
Filed: Apr. 19, 2002

Related U.S. Application Data (60) Provisional application No. 60/364,249, filed on Mar. 13, 2002.

(51) Int. Cl.
*G01T 1/24* (2006.01)
*G01T 1/00* (2006.01)
*H01J 40/14* (2006.01)
*H01L 27/146* (2006.01)
*H01J 40/00* (2006.01)

(52) U.S. Cl.
CPC ..... *H01L 27/14634* (2013.01); *H01L 27/14661* (2013.01); *H01L 27/14636* (2013.01)

USPC .................................. 250/370.13; 250/370.11

(58) Field of Classification Search
None
See application file for complete search history.

(56) References Cited

To view the complete listing of prior art documents cited during the proceeding for Reexamination Control Number 90/011,681, please refer to the USPTO's public Patent Application Information Retrieval (PAIR) system under the Display References tab.

*Primary Examiner* — Albert J Gagliardi (57) ABSTRACT

An x-ray and gamma-ray radiant energy imaging device is disclosed having a temperature sensitive semiconductor detector substrate bump-bonded to a semiconductor CMOS readout substrate. The temperature sensitive, semiconductor detector substrate utilizes Tellurium compound materials, such as CdTe and CdZnTe. The bump bonds are formed of a low-temperature, lead-free binary solder alloy having a melting point between about 100° C. and about 180° C. Also described is a process for forming solder bumps utilizing the low-temperature, lead-free binary solder alloy, to prevent damage to temperature sensitive and potentially brittle detector substrate when assembling the imaging device.

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1-16 are cancelled.

\* \* \* \* \*